United States Patent [19]

Sato

[11] Patent Number: 5,543,651
[45] Date of Patent: Aug. 6, 1996

[54] SEMICONDUCTOR INTEGRATED CIRCUIT DEVICE

[75] Inventor: Kazuo Sato, Kyoto, Japan

[73] Assignee: Rohm Co. Ltd., Kyoto, Japan

[21] Appl. No.: 413,219

[22] Filed: Mar. 28, 1995

[30] Foreign Application Priority Data

Mar. 29, 1994 [JP] Japan .................................. 6-058425

[51] Int. Cl.$^6$ .................................................. H01L 29/76
[52] U.S. Cl. ........................ 257/369; 257/401; 257/773; 257/786
[58] Field of Search .................................... 257/369, 401, 257/773, 786

[56] References Cited

U.S. PATENT DOCUMENTS 5,162,893  11/1992  Okano ..................................... 257/369
5,266,826  11/1993  Umeyama ............................... 257/786

*Primary Examiner*—Mark V. Prenty
*Attorney, Agent, or Firm*—Nikaido, Marmelstein, Murray & Oram LLP

[57] ABSTRACT

A semiconductor integrated circuit device includes a semiconductor chip having a long side and a short side. The semiconductor chip includes a memory cell area occupying approximately 80 percent of the area of the semiconductor chip and an input and output circuit area provided at an end portion of the semiconductor chip along the short side. Pads and two types of MOS transistors are arranged in an efficient manner to reduce the area of the input and output circuit area. Specifically, a plurality of pads are arranged along the short side in the input and output circuit area and the MOS transistors each constituting a group together with the pad are arranged in an area on the inside of the pads within the chip.

4 Claims, 4 Drawing Sheets

(a)    (b)

SEMICONDUCTOR INTEGRATED CIRCUIT DEVICE

BACKGROUND OF THE INVENTION

1. Field of the Invention

The invention relates to a semiconductor integrated circuit device such as a semiconductor memory.

2. Description of the Prior Art

Referring to FIG. 1, there is shown a typical layout of a semiconductor memory 11. The memory 11 is of a rectangle having a short side X and a long side Y, and a memory cell area 12 is provided inside. The memory area 12 occupies approximately 80 percent of the entire area. Reference designations 13A and 13B represent control areas where circuits for controlling the memory cell are provided. Input and output areas 14A and 14B are provided on the outside of the control areas 13A and 13B. In the input and output areas 14A and 14B, pads 15 and transistors P and N are provided along the short side X.

In the input and output areas 14A and 14B, an output circuit and an input circuit are provided. The output circuit includes, as shown in FIG. 6, a P-channel metal oxide semiconductor (MOS) transistor P and an N-channel MOS transistor N connected between a power supply line $V_{DD}$ and a reference potential point 8. The drains of the transistors P and N are connected to a pad PAD. In the input circuit, as shown in FIG. 7, the pad PAD is connected to the gates of the P-channel transistor P and the N-channel transistor N, and the drains are connected to a buffer 9 provided in the control areas 13A and 13B.

Referring to FIG. 2, there is shown the arrangement of the pads and MOS transistors in the input and output circuits of FIG. 1. For example, P2 and N2 on the left and right sides of a pad PAD2 respectively represent a P-channel MOS transistor and an N-channel MOS transistor of the circuit shown in FIG. 6 or 7. Thus, the pad PAD2 and the transistors P2 and N2 constitute a group of input or output circuits. Likewise, a pad PAD3 and transistors P3 and N3 constitute a group.

In this case, to avoid latch up (a phenomenon that two parasitic bipolar transistors of PNP and NPN types formed in an integrated circuit (IC) using complementary metal oxide semiconductor (CMOS) transistors are in thyrister operation state), the groups are arranged so that the P-channel MOS transistors and the N-channel MOS transistors are separately arranged from each other and that transistors of the same conductivity type (e.g. P1 and P2, N2 and N3, and P3 and P4) adjoin each other.

In the conventional memory layout, the integrated circuit density depends on a size L in the X direction of one output circuit (or input circuit) shown in FIG. 2, and the realization of a higher integrated circuit density is impossible. For this reason, although the size of the main part of the chip can be reduced like a small capacity memory using a fine process, the size (in particular, the size in the X direction) of the input and output circuit portion cannot be reduced. As a result, the size of the chip cannot be sufficiently reduced.

The same is true of a semiconductor integrated circuit device like a multi-output memory having a number of pads compared to the chip size. This problem also stems from the fact that although the technology to reduce the device sizes of transistors has advanced, the size of the pad cannot always be reduced because of the problem of the bonding of connecting wires. Incidentally, the size of the pad is 110 μm×110 μm.

SUMMARY OF THE INVENTION

An object of the present invention is to provide a semiconductor integrated circuit device where the size of the entire chip is reduced by efficiently arranging pads and transistors of the input and output circuits.

To achieve the above-mentioned object, according to the present invention, in a semiconductor integrated circuit device where a plurality of groups each consisting of a pad and P-channel and N-channel metal oxide semiconductor transistors connected to the pad are arranged in an end area along a short side of a semiconductor chip having the short side and a long side, a plurality of the pads are arranged along the short side, and the metal oxide semiconductor transistors constituting the groups together with the pads are arranged in an area on an inside of the pads within the chip.

According to such features, the area of the input and output circuit increases along the long side of the chip and the size along the short side is reduced accordingly. As a result, the chip size of the entire semiconductor integrated circuit device is reduced.

BRIEF DESCRIPTION OF THE DRAWINGS

This and other objects and features of this invention will become clear from the following description, taken in conjunction with the preferred embodiments with reference to the accompanied drawings in which.

DESCRIPTION OF THE PREFERRED EMBODIMENTS

Figure 1:
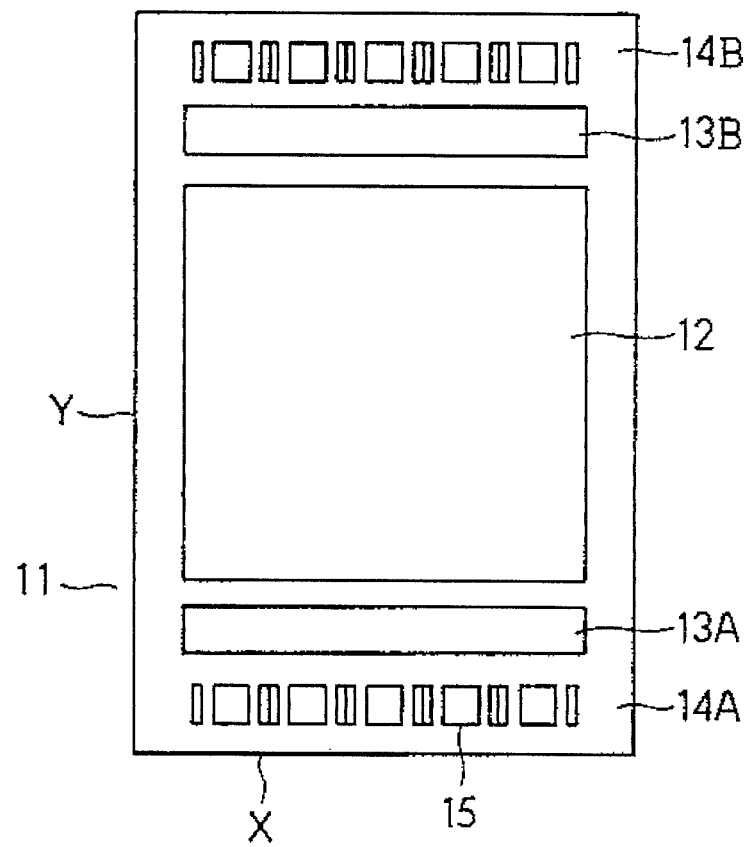
FIG. 1 shows a layout pattern of a conventional semiconductor memory.
Figure 2:
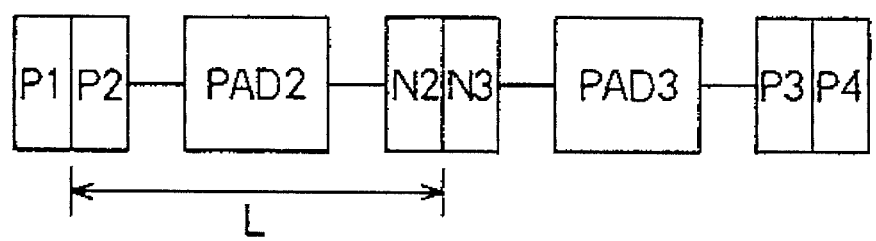
FIG. 2 shows the arrangement of a relevant portion of the conventional semiconductor memory.
Figure 3:
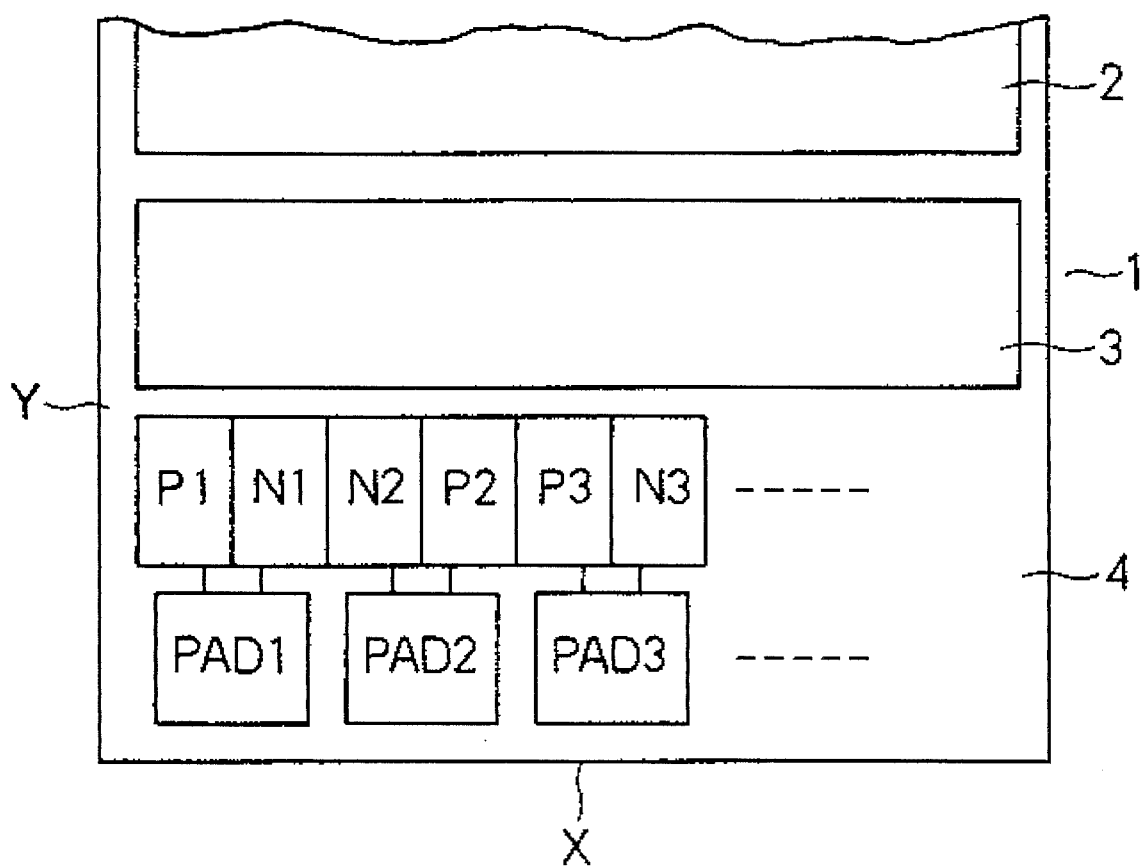
FIG. 3 shows a layout pattern of a relevant portion of a semiconductor memory embodying the present invention.

Hereinafter, embodiments shown in the drawings will be described. Referring to FIG. 3 showing an embodiment of the present invention, reference numeral 1 represents a semiconductor memory chip comprising a static random access memory (SRAM), and reference numeral 2 represents a memory cell area occupying approximately 80 percent of the entire device. Reference numeral 3 represents a control area in which a control circuit for controlling the memory cell are provided. Reference numeral 4 represents an input and output circuit area. In the input and output circuit area 4, pads PAD1, PAD2, PAD3, . . . are arranged in a row along the short side X. MOS transistors constituting groups together with the pads are arranged on the inside of the pads from the short side X of the chip 1.

Figure 6:
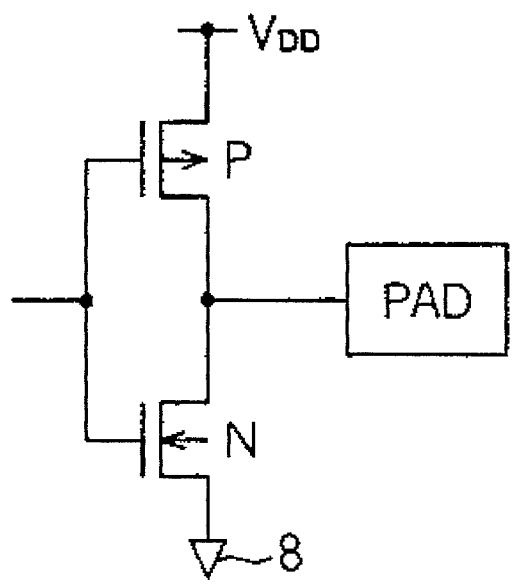
FIG. 6 is a circuit diagram showing an input circuit portion of an input and output circuit.
Figure 7:
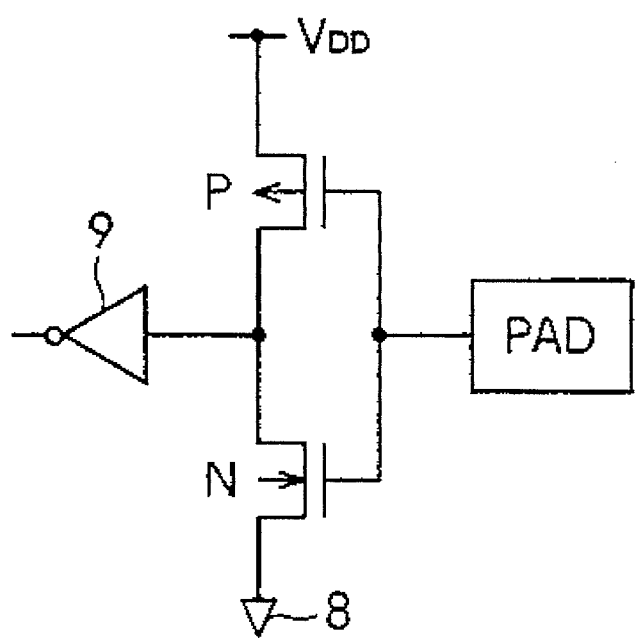
FIG. 7 is a circuit diagram showing an output circuit portion of the input and output circuit.

Specifically, a P-channel MOS transistor P1 constituting a group together with the pad PAD1 is arranged on the left end on the inside of the pad PAD1 from the short side X of the chip 1 and an N-channel MOS transistor N1 is arranged on the right side thereof. An N-channel MOS transistor N2 constituting a group together with the pad PAD2 is arranged next to the transistor N1, and a P-channel MOS transistor P2 is arranged on the right side thereof. Thus, two adjoining N-channel MOS transistors and two adjoining P-channel MOS transistors are arranged alternately. To avoid latch up as much as possible, the transistors are arranged so that transistors of the same conductivity type adjoin each other. While only the lower part of the semiconductor memory chip 1 (the lower part of the figure) is shown in FIG. 3, in the upper part (not shown), a row of pads and a row of transistors are provided in a similar manner. In that case, the row of pads is arranged just inside the short side X of the chip 1 and the row of transistors is arranged on the inside of the row of pads. The transistors P1 and N1 and the pad PAD1 constitute the output circuit of FIG. 6 or the input circuit of FIG. 7. Likewise, the pad PAD2 and the transistors N2 and P2 and the pad PAD3 and the transistors N3 and P3 constitute the output or the input circuit.

Figure 4A:
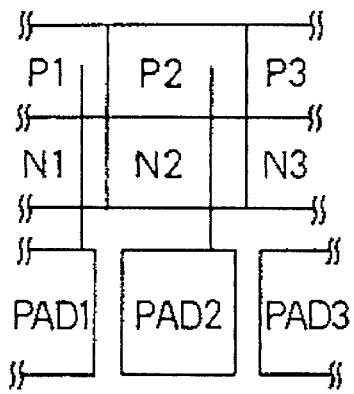
FIGS. 4A to 4C show layout patterns of other embodiments of the present invention.
Figure 4B:
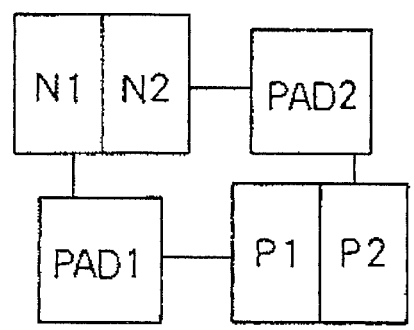
Figure 4C:
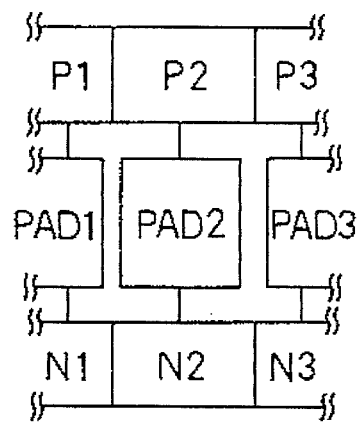

FIGS. 4A to 4C show variations of the arrangement of the pads and MOS transistors. While the transistors P1 to P3 and N1 to N3 of FIG. 3 are longitudinally long (i.e. longer along the long side Y of the chip 1), the transistors P1 to P3 and N1 to N3 of FIG. 4A are laterally long (i.e. longer along the short side X). The transistors are arranged in two rows in the Y direction. Specifically, the row of the N-channel transistors N1, N2 and N3 is arranged closer to the row of the pads PAD1, PAD2 and PAD3, and the row of the P-channel transistors P1, P2 and P3 is arranged farther therefrom. The groups of the pads and transistors are present in correspondence with the Y direction. For example, the pad PAD1 and the transistors N1 and P1 are arranged in the Y direction.

In FIG. 4B, a first pad PAD1 and a second pad PAD2 are provided at one pair of opposite angles of a virtual rectangle, and the N-channel MOS transistors N1 and N2 and the P-channel MOS transistors P1 and P2 are provided at the other pair of opposite angles. In this case, the transistors N1 and P1 are arranged close to the first pad PAD1, and the transistor N2 and P2 are arranged close to the second pad PAD2. The arrangement of FIG. 4B is employed for the arrangement of the third and fourth pads and corresponding MOS transistors.

In FIG. 4C, with the row of the pads PAD1, PAD2 and PAD3 between, the row of the N-channel transistors N1, N2 and N3 is arranged on the outside of the pads and the row of the P-channel transistors P1, P2 and P3 are arranged on the inside of the pads.

In any of the four arrangements of FIG. 3 and FIGS. 4A to 4C, the size of the short side X is reduced and the chip size of the semiconductor memory chip 1 is reduced accordingly. That is, although the size along the long side Y slightly increases, the size of the entire chip decreases since the size along the short side X decreases. In these arrangements, the position of the P-channel MOS transistors and the position of the N-channel MOS transistors may be replaced with each other.

Figure 5:
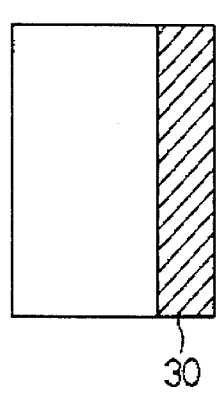
FIG. 5 is a view of assistance in explaining an advantage of the present that the chip size is reduced.
Figure 5:
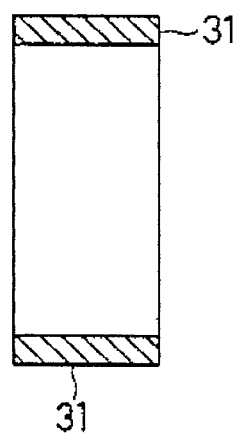

FIG. 5 conceptionally shows this size reduction. (a) shows a conventional arrangement and (b) shows an arrangement according to the present invention. According to the present invention, the hatched portion 30 is removed and the hatched portion 31 is added. However, it is apparent that the reduced portion 30 is larger than the added portion 31. If the transistors of the input and output circuit are formed in the control area 3, the size along the long side Y does not increase. In that case, the size is further reduced. In this case, only the transistors can be formed in the control area 3 and the pads cannot be formed. Therefore, this arrangement can be employed for the arrangements of FIG. 3, 4A and 4C. In the arrangement of FIG. 4C, the row of transistors (i.e. transistors P1, P2, P3, ...) located on the inside of the pads are formed in the control area 3.

Describing advantages and disadvantages of the arrangements of FIGS. 3, 4A, 4B and 4C other than the common advantage that the chip size is reduced, with respect to the prevention of latch up, the arrangements of FIG. 4B and 4C are superior. With respect to the bonding of connecting wires to the pads, the arrangements of FIG. 3 and FIG. 4A are preferable and the arrangement of FIG. 4C is next preferable.

While the present invention is employed for a semiconductor memory in the above-described embodiment, the present invention may be employed for any integrated circuit device other than the memory.

As described above, according to the present invention, the size along the short side of a semiconductor integrated circuit device is reduced to thereby reduce the size of the entire device.

Obviously, many modifications and variations of the present invention are possible in light of the above teachings. It is therefore to be understood that within the scope of the appended claims, the invention may be practiced other than as specifically described.

What is claimed is:

1. A semiconductor integrated circuit device comprising:

a semiconductor chip having a long side and a short side;

a memory cell area occupying a large portion of an area of the semiconductor chip;

an input and output circuit area provided at an end portion of the semiconductor chip along the short side;

a row of a plurality of pads arranged in the input and output circuit area along the short side;

a row of a plurality of P-channel metal oxide semiconductor transistors alternately arranged and a plurality of N-channel metal oxide semiconductor transistors provided on an inside of the pads in the input and output circuit area of the semiconductor chip; and means for connecting the pads and the P-channel and N-channel metal oxide semiconductor transistors.

2. A semiconductor integrated circuit device where a plurality of groups each consisting of a pad and P-channel and N-channel metal oxide semiconductor transistors connected to the pad are arranged in an end area along a short side of a semiconductor chip having the short side and a long side, wherein a plurality of the pad are arranged along the short side, and wherein the metal oxide semiconductor transistors constituting the groups together with the pads are arranged in an area on an inside of the pads within the chip.

3. A semiconductor integrated circuit device where a plurality of groups each consisting of a pad and P-channel and N-channel metal oxide semiconductor transistors connected to the pad are arranged in an end area along a short side of a semiconductor chip having the short side and a long side, wherein a plurality of the pads are arranged along the short side, and wherein one type of the metal oxide semiconductor transistors constituting the groups together with the pads are arranged in an area on an inside of the pads within the chip and another type of the metal oxide semiconductor transistors are arranged in an area on an outside of the pads within the chip.

4. A semiconductor integrated circuit device where a plurality of groups each consisting of a pad and P-channel and N-channel metal oxide semiconductor transistors connected to the pad are arranged in an end area along a short side of a semiconductor chip having the short side and a long side, wherein a first pad and a second pad are provided at one pair of opposite angles of a virtual rectangle, and wherein a pair of N-channel MOS transistors and a pair of P-channel MOS transistors are provided at another pair of opposite angles of the virtual rectangle.

* * * * *